United States Patent
Jayasekara

(10) Patent No.: US 7,623,325 B2
(45) Date of Patent: Nov. 24, 2009

(54) METHOD FOR PROVIDING AN ENDPOINT LAYER FOR ION MILLING OF TOP OF READ SENSOR HAVING TOP LEAD CONNECTION AND SENSOR FORMED THEREBY

(75) Inventor: Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 321 days.

(21) Appl. No.: 11/239,514

(22) Filed: Sep. 29, 2005

(65) Prior Publication Data

US 2007/0068797 A1 Mar. 29, 2007

(51) Int. Cl.
G11B 5/127 (2006.01)
(52) U.S. Cl. .................................. 360/324.2
(58) Field of Classification Search .............. 360/324.2, 360/324.111, 125, 314, 324.11; 204/192.34; 216/22; 451/296
See application file for complete search history.

(56) References Cited

U.S. PATENT DOCUMENTS

| | | | |
|---|---|---|---|
| 6,477,013 B1 * | 11/2002 | Kang et al. | 360/236.3 |
| 6,685,845 B2 * | 2/2004 | Wu et al. | 216/22 |
| 6,744,608 B1 | 6/2004 | Sin et al. | |
| 6,815,248 B2 | 11/2004 | Leuschner et al. | |
| 6,857,947 B2 * | 2/2005 | Wang et al. | 451/296 |
| 6,870,713 B2 | 3/2005 | Shimazawa | |
| 6,897,532 B1 | 5/2005 | Schwarz et al. | |
| 7,405,909 B2 * | 7/2008 | Gill | 360/324.12 |
| 2002/0036877 A1 * | 3/2002 | Sakakima et al. | 360/324.11 |
| 2002/0114112 A1 * | 8/2002 | Nakashio et al. | 360/324.2 |
| 2002/0131209 A1 * | 9/2002 | Anaya-Dufresne et al. | 360/236.2 |
| 2002/0191335 A1 * | 12/2002 | Santini | 360/125 |
| 2003/0128483 A1 * | 7/2003 | Kamijo | 360/324.11 |
| 2004/0166368 A1 * | 8/2004 | Gill et al. | 428/692 |
| 2005/0068691 A1 * | 3/2005 | Kagami et al. | 360/324.2 |
| 2005/0254180 A1 * | 11/2005 | Kanakasabapathy et al. | 360/324.2 |
| 2006/0226940 A1 * | 10/2006 | Lee et al. | 335/216 |
| 2007/0081279 A1 * | 4/2007 | Hong et al. | 360/324.1 |
| 2007/0138002 A1 * | 6/2007 | Carey et al. | 204/192.34 |
| 2007/0217085 A1 * | 9/2007 | Gill | 360/324.12 |

OTHER PUBLICATIONS

Nagasaka—Giant Magnetoresistance Propertise of Specular Spin Valve Films in a Current Perpendicular to Plane Structure; Journal; Jun. 1, 2001;pp. 6943-6945; vol. 89, No. 11.

* cited by examiner

*Primary Examiner*—Allen T Cao
(74) *Attorney, Agent, or Firm*—Merchant & Gould

(57) ABSTRACT

A method for providing an endpoint layer for ion milling of top of read sensor having top lead connection and sensor formed thereby. A cap layer includes a thin layer of an endpoint detection material, such as a conductive or insulating material, that is inserted in the cap layer. The endpoint detection material provides a good signal for endpoint detection during ion milling of the of the cap layer.

19 Claims, 7 Drawing Sheets

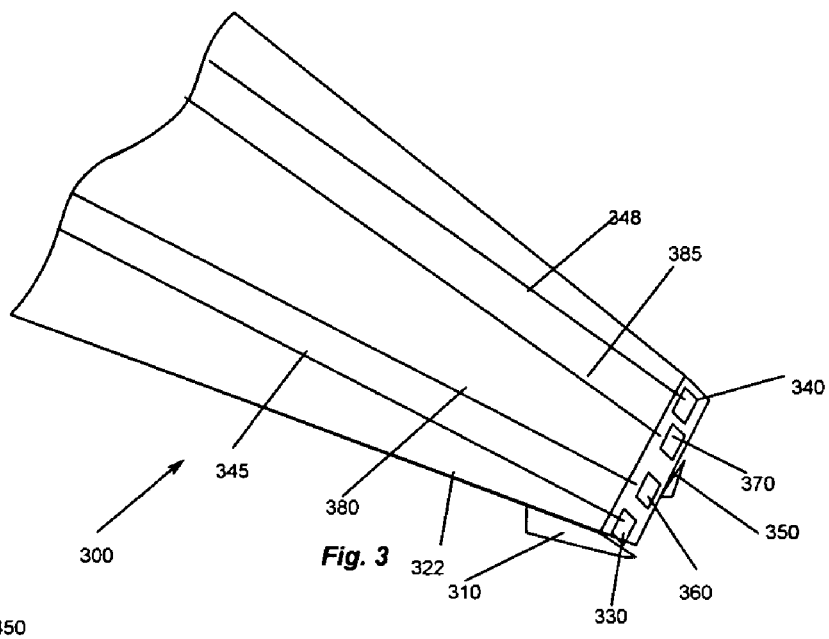
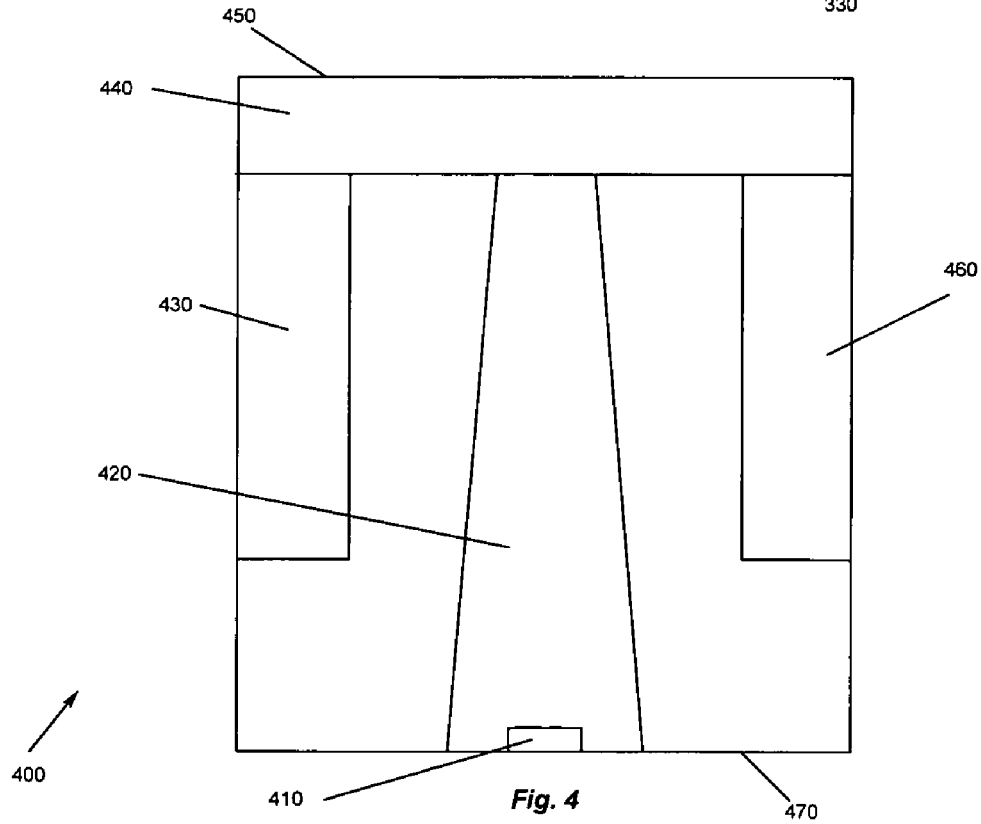

METHOD FOR PROVIDING AN ENDPOINT LAYER FOR ION MILLING OF TOP OF READ SENSOR HAVING TOP LEAD CONNECTION AND SENSOR FORMED THEREBY

BACKGROUND OF THE INVENTION

1. Field of the Invention

This invention relates in general to magnetic sensors, and more particularly to a method for providing an endpoint layer for ion milling of top of read sensor having top lead connection and sensor formed thereby.

2. Description of Related Art

Magnetic recording is a key and invaluable segment of the information-processing industry. While the basic principles are one hundred years old for early tape devices, and over forty years old for magnetic hard disk drives, an influx of technical innovations continues to extend the storage capacity and performance of magnetic recording products. For hard disk drives, the areal density or density of written data bits on the magnetic medium has increased by a factor of more than two million since the first disk drive was applied to data storage. Areal density continues to grow due to improvements in magnet recording heads, media, drive electronics, and mechanics.

The use of a magnetoresistive (MR) and giant magnetoresistive (GMR) sensors to sense magnetically recorded data has been known for many years. The GMR sensor includes a spin-valve film that provides a high magnetoresistance ratio (MR ratio) as compared with a conventional MR head. The MR ratio is the percentage change in resistance as an external magnetic field is switched between high and low values.

Recently, in order to satisfy the demand for higher recording density in an HDD apparatus, higher sensitivity and larger output of a thin-film magnetic head are required. A tunnel magnetoresistive effect (TMR) element and a Current-Perpendicular-To-Plane (CPP) GMR element meet these requirements and are beginning to receive attention. The TMR element utilizes a ferromagnetic tunnel effect and has a multi-layered structure including a lower ferromagnetic thin-film layer, a tunnel barrier layer and an upper ferromagnetic thin-film layer. The CPP GMR element is one type of GMR element of a multi-layered structure including a lower ferromagnetic thin-film layer, a nonmagnetic metal layer and an upper ferromagnetic thin-film layer.

These elements not only offer MR ratios several times greater than that of a general GMR element such as CIP (Current-In-Plane) GMR element in which a current flows along the surface of layers, but also implements narrow gaps between layers without difficulty. The terms "lower" in "lower ferromagnetic thin-film layer" and "upper" in "upper ferromagnetic thin-film layer" are selectively used depending on the position of the layer relative to the substrate. In general, a layer is "lower" if this layer is close to the substrate, and "upper" if the layer is away from the substrate.

In the fabrication of a CPP read sensor, the sensor is electrically connected to the top shield (S2). Prior to depositing the S2 layer, the top of the read sensor has to be etched in order to make a good electrical contact between the sensor and S2. Often the sensor capping material that has to be etched is a slow etching material, such as tantalum (Ta). A capping material such as Ta also would have an oxide layer of variable thickness.

The etching of the capping material has to be well controlled. If the etching of the capping material is not well controlled, over-etching can cause sensor damage and under-etching can lead to poor electrical contact between the sensor and S2. Further, over or under-etching can lead to poor spacing between the sensor and S2, i.e., gap2 thickness control.

It can be seen then that there is a need for a method for providing an endpoint layer for ion milling of top of read sensor having top lead connection and sensor formed thereby.

SUMMARY OF THE INVENTION

To overcome the limitations in the prior art described above, and to overcome other limitations that will become apparent upon reading and understanding the present specification, the present invention discloses a method for providing an endpoint layer for ion milling of top of read sensor having top lead connection and sensor formed thereby.

The present invention provides a marker layer for detecting a desired endpoint during material removal. The marker layer, such as a conductive or insulating material, is inserted in the cap layer. The conductive or insulating material provides a good signal for endpoint detection during ion milling of the of the cap layer.

A method for providing an endpoint layer for ion milling of top of read sensor having top lead connection includes forming a cap layer and forming an endpoint detection material within the cap layer.

In another embodiment of the present invention, a method for forming a read sensor is provided. The method for forming a read sensor includes forming a cap layer over a sensor element, forming an endpoint detection material within the cap layer, ion milling the cap layer and monitoring the ion milling until the endpoint detection material is detected.

In another embodiment of the present invention, a magnetoresistive sensor is provided. The magnetoresistive sensor includes a first shield layer, a tunnel valve sensor element formed over the first shield layer and a cap layer formed over the tunnel valve sensor element; the cap layer including an endpoint detection material disposed within the cap layer for enabling easy endpoint detection during ion milling of the of the cap layer.

In another embodiment of the present invention, a magnetic storage system is provided. The magnetic storage system includes a moveable magnetic storage medium for storing data thereon, an actuator positionable relative to the moveable magnetic storage medium and a magnetoresistive sensor, coupled to the actuator, for reading data from the magnetic recording medium when position to a desired location by the actuator, wherein the magnetoresistive sensor further includes a first shield layer, a tunnel valve sensor element formed over the first shield layer and a cap layer formed over the tunnel valve sensor element; the cap layer including an endpoint detection material disposed within the cap layer for enabling easy endpoint detection during ion milling of the of the cap layer.

In another embodiment of the present invention, another magnetoresistive sensor is provided. This magnetoresistive sensor includes means for sensing magnetic data recorded on a magnetic recording media, first means, coupled to the means for sensing, for providing a shield to a sensor element and means, coupled to the means for sensing, for protecting the means for sensing; the means for protecting including means, disposed within the means for protecting, for enabling easy endpoint detection during ion milling of the of the means for protecting.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 illustrates a suspension structure for a magnetic head;

FIG. 4 is an ABS view of slider and magnetic head;

DETAILED DESCRIPTION OF THE INVENTION

In the following description of the exemplary embodiment, reference is made to the accompanying drawings, which form a part hereof, and in which is shown by way of illustration the specific embodiment in which the invention may be practiced. It is to be understood that other embodiments may be utilized as structural changes may be made without departing from the scope of the present invention.

The present invention provides a method for providing an endpoint layer for ion milling of top of read sensor having top lead connection and sensor formed thereby. An endpoint detection material, such as a conductive or insulating material, is inserted in the cap layer. The conductive or insulating material provides a good signal for endpoint detection during ion milling of the of the cap layer.

Figure 1:
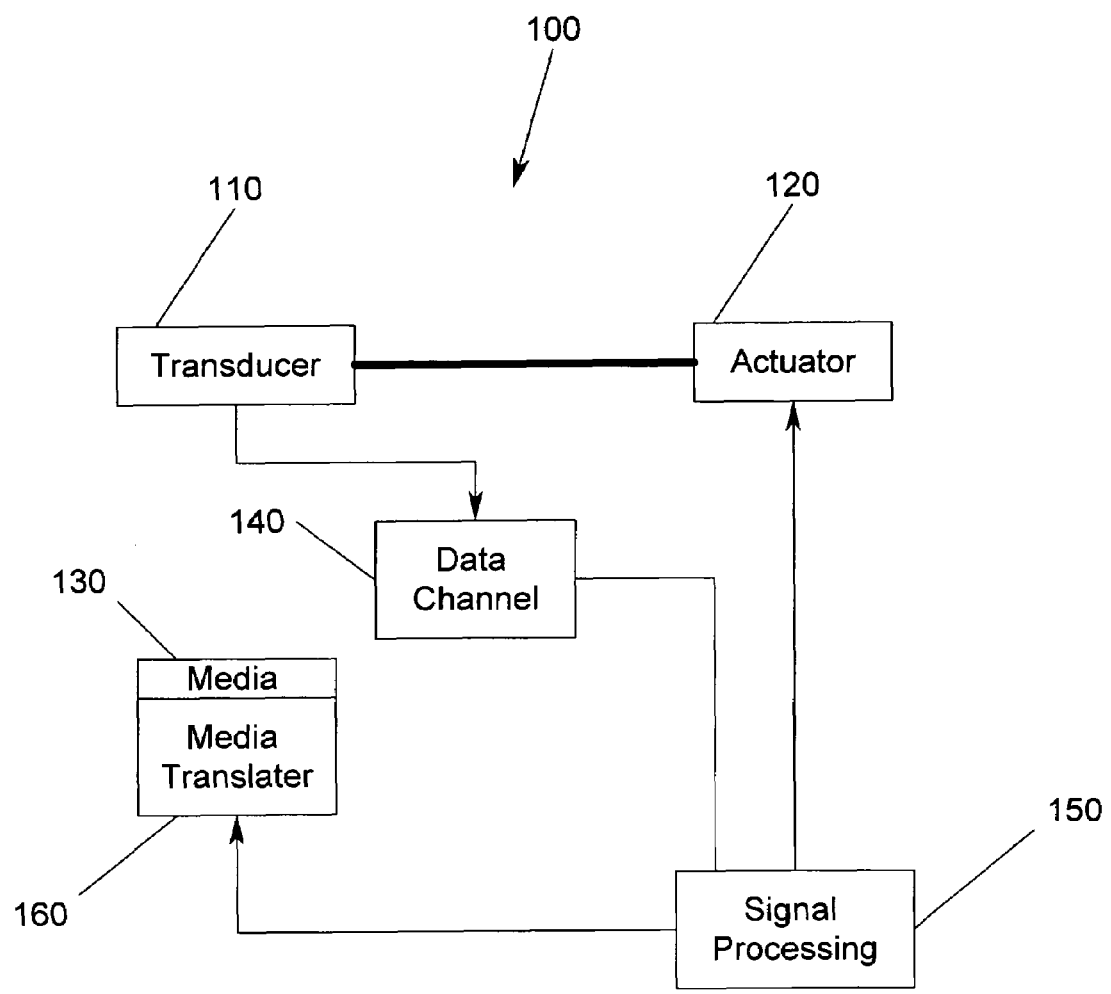
FIG. 1 illustrates a storage system.

FIG. 1 illustrates a storage system 100. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor 150 controls the actuator 120 and processes the signals of the data channel 140. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
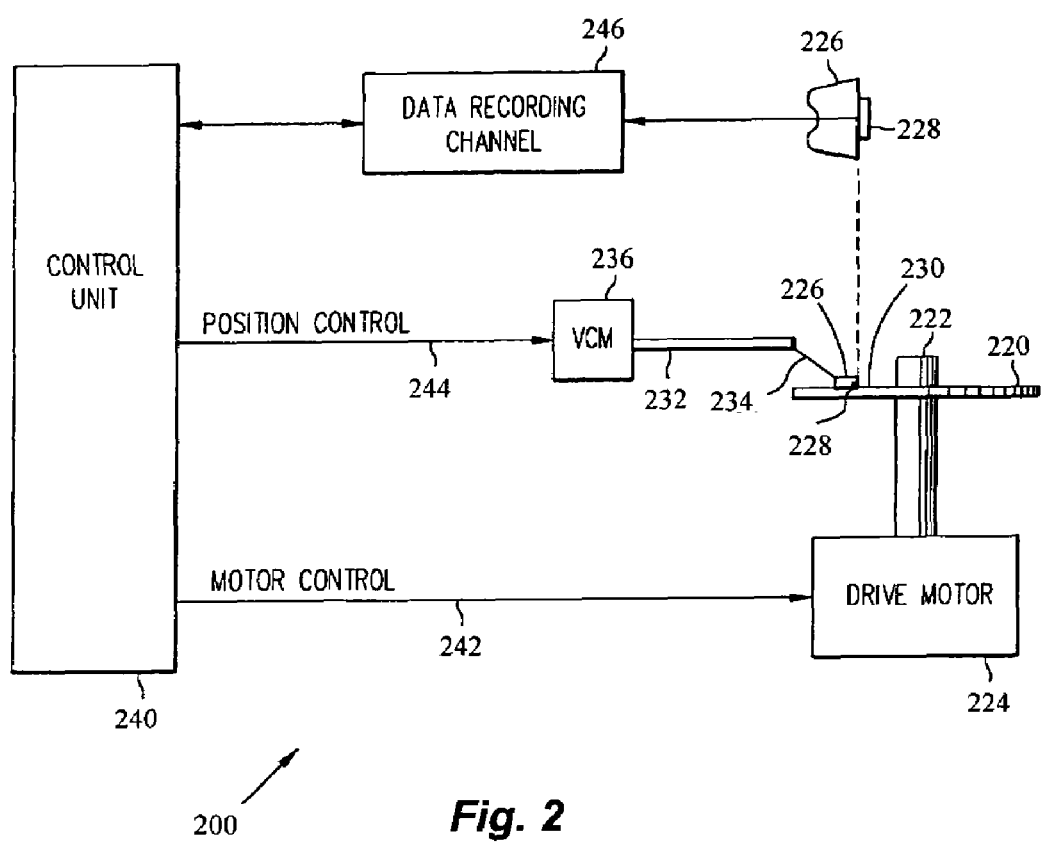
FIG. 2 is an illustration of one example of a magnetic disk drive storage system.

FIG. 2 is an illustration of one example of a magnetic disk drive storage system 200. As shown in FIG. 2, at least one rotatable magnetic disk 220 is supported on a spindle 222 and rotated by a disk drive motor 224. The magnetic recording media on each disk 220 is in the form of an annular pattern of concentric data tracks (not shown).

At least one slider 226 is positioned on the disk 220, each slider 226 supporting one or more magnetic read/write heads 228, wherein the heads 228 incorporate a sensor of the present invention. As the disk(s) 220 rotate, slider 226 is moved radially in and out over disk surface 230 so that the heads 228 may access different portions of the disk 220 wherein desired data is recorded. Each slider 226 is attached to an actuator arm 232 by means of a suspension 234. The suspension 234 provides a slight spring force, which biases the slider 226 against the disk surface 230. Each actuator arm 232 is attached to an actuator 236. The actuator 236 may be, for example, a voice coil motor (VCM). The actuator 236 is controlled by position control signals 244 supplied by a control unit 240.

During operation of the disk drive 200, the rotation of the disk 220 generates an air bearing between the slider 226 and the disk surface 230, which exerts an upward force or lift on the slider 226. The surface of the slider 226, which includes the heads 228 and faces the surface of disk 220 is referred to as an air-bearing surface (ABS). The air bearing thus counterbalances the slight spring force of suspension 234 and, during normal operation, supports the slider 226 off of, and slightly above, the disk surface 230 at a small, substantially constant spacing.

The various components of the disk drive 200 are controlled in operation by control signals generated by a control unit 240, such as access control signals and internal clock signals. Typically, control unit 240 has logic control circuits, storage apparatus, and a microprocessor. The control unit 240 generates control signals to control various system operations such as drive motor control signals 242 and head position control signals 244. The position control signals 244 provide the desired current profiles to optimally move and position the slider 226 to the desired data track on the disk 220. Read and write signals are communicated to and from the read/write heads 228 through a recording channel 246.

The above description of a typical magnetic disk drive storage system 200 is for representation purposes only. It should be apparent that storage systems may contain a large number of disks and actuators, and that each actuator may support a number of sliders. Many other variations of the basic typical magnetic storage system 200 may be used in conjunction with the present invention while keeping within the scope and intention of the invention. However, those skilled in the art will recognized that the present invention is not meant to be limited to magnetic disk drive storage systems as illustrated in FIG. 2.

FIG. 3 illustrates a suspension structure 300 for a magnetic head. A slider 310 mounted on a suspension 322. First and second solder connections 330 and 340 connect leads from the sensor 350 to leads 345 and 348, respectively, on suspension 322 and third and fourth solder connections 360 and 370 connect to the write coil (not shown) to leads 380 and 385, respectively, on suspension 322.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of magnetic storage systems, shown in the accompanying FIGS. 1-4, are for presentation purposes only and the present invention is not meant to be limited to the magnetic storage systems illustrated therein. For example, magnetic storage systems may contain a plurality of recording media, such as magnetic tape, and actuators, and each actuator may support a number of sliders. In addition, instead of an air-bearing slider, the head carrier may be one that maintains the head in contact or near contact with the medium, such as in liquid bearing and other contact and near-contact recording devices.

Figure 5:
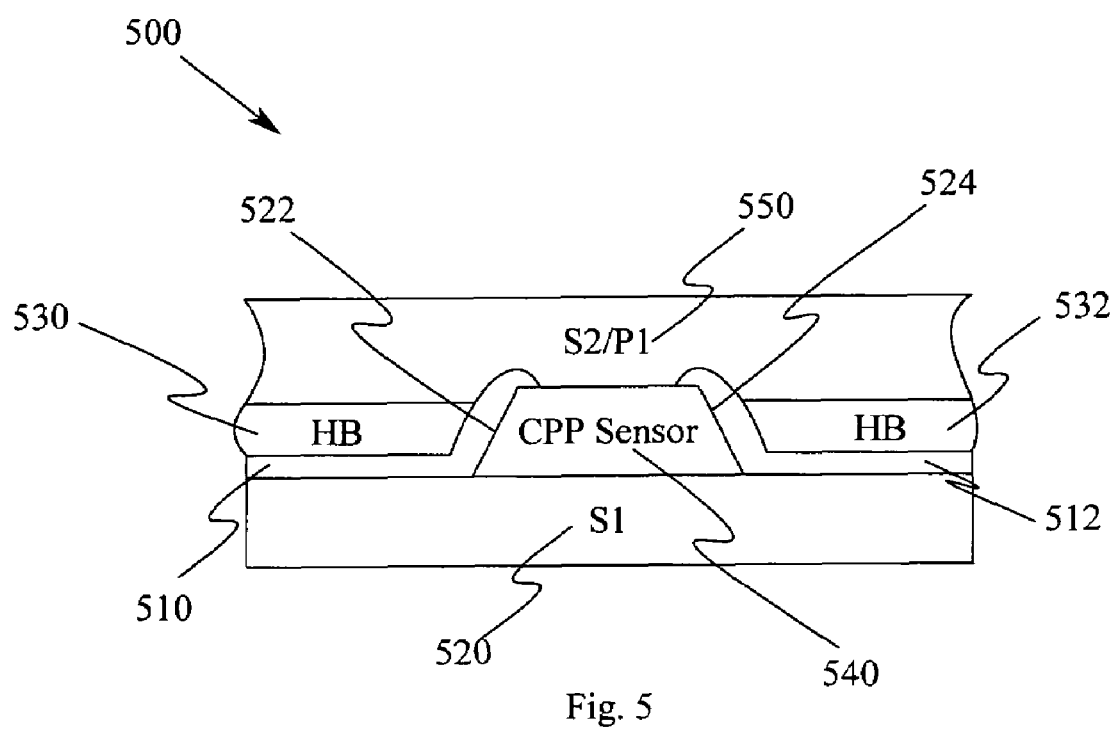
FIG. 5 illustrates a Current-Perpendicular-To-Plane (CPP) GMR sensor according to an embodiment of the present invention.

FIG. 5 illustrates a Current-Perpendicular-To-Plane (CPP) GMR sensor 500 according to an embodiment of the present invention. In FIG. 5, first and second insulation layers 510 and 512, such as alumina ($Al_2O_3$), cover the first shield layer 520 on each side of the sensor 500 as well as slightly covering first and second side walls 522, 524 of CPP element 540. First and second hard bias layers 530, 532 are on the insulation layers 510, 512 and are adjacent the side walls 522, 524. The hard bias layers 530, 532 cause magnetic fields to extend longitudinally through the CPP element 540 for stabilizing the free layer. The CPP element 540 and the first and second hard bias layers 530, 532 are located between ferromagnetic first and second shield layers 520, 550, which may serve as leads for conducting the perpendicular current ($I_p$) through the CPP element 540.

Figure 6:
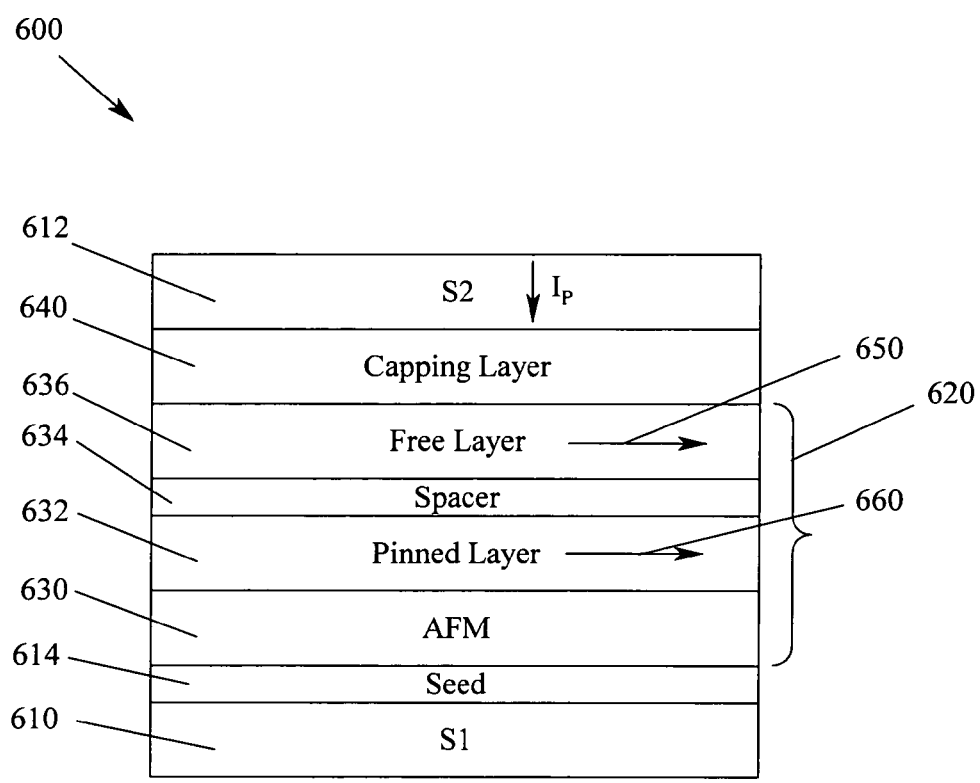
FIG. 6 illustrates the layers of the a tunnel valve (TV) CPP sensor according to an embodiment of the present invention.

FIG. 6 illustrates the layers of a tunnel valve (TV) CPP sensor 600 according to an embodiment of the present invention. In FIG. 6, a first shield layer 610 is formed and a seed layer 614 is formed thereon. The sensor 620 is formed between the first shield 610 and a second shield 612. The first and second shield layers 610, 612 serve as first and second lead layers. The first and second shield layers 610, 612 conduct a perpendicular current $I_p$ through the sensor 620 perpendicular to the major planes of the layers of the sensor.

The sensor 620 illustrated in FIG. 6 further includes an AFM pinning layer 630 formed on the seed layer 614. An antiparallel (AP) pinned layer structure 632 is formed over the AFM pinning layer 630. A nonmagnetic electrically conductive or nonconductive material spacer layer 634 is located between a free layer structure 636 and the AP pinned layer structure 632. A cap layer 640 is located between S2 612 and the free layer 636 to protecting the free layer 636 from subsequent processing steps and to prevent oxidization of the free layer 636.

Because the free layer structure 636 is located between the AP pinned layer structure 632 and the second shield layer (S2) 612 the spin valve sensor 600 is a bottom spin valve sensor. However, those skilled in the art will recognize that the present invention is not meant to be limited to a bottom spin valve sensor, but is applicable to a top spin valve sensor, a dual spin valve sensor, etc. In addition, it should be understood that with the embodiment shown in FIG. 6, that the AFM pinning layer 630 may be employed or omitted. If the AFM pinning layer 630 is omitted the AP pinned layer structure is self-pinning. The pinned layer 632 and the free layer 636 may be single layer structures or composite structures. The antiferromagnetic (AFM) pinning layer 630 interfaces and is exchange coupled to the pinned layer 632 for pinning a magnetic moment 660 of the pinned layer 632 parallel to the ABS and parallel to the major thin film planes of the layers of the sensor. When a field signal from the rotating magnetic disk rotates the magnetic moment 650 into the sensor, the resistance of the sensor increases.

Figure 7:
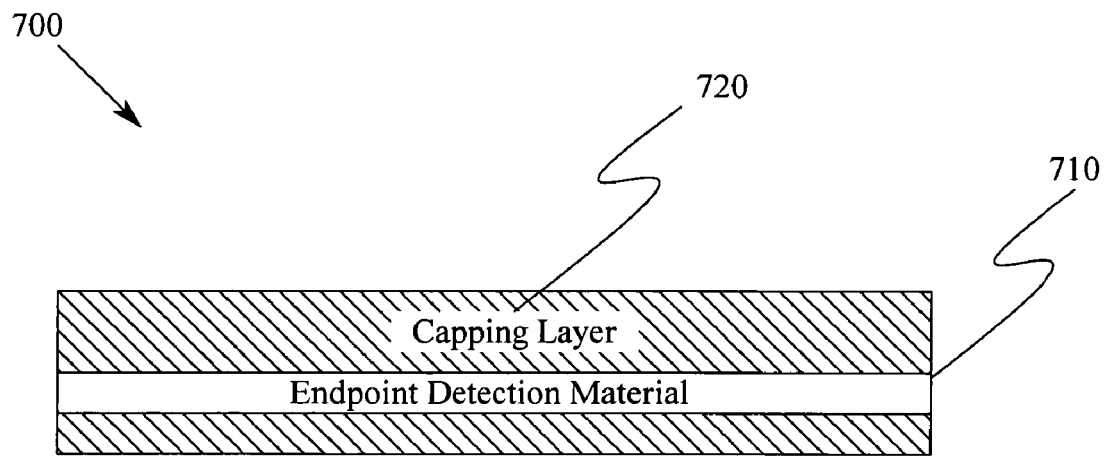
FIG. 7 illustrates a cap layer according to an embodiment of the present invention.

FIG. 7 illustrates a cap layer 700 according to an embodiment of the present invention. In FIG. 7, the cap layer 700 includes a thin endpoint detection material 710, such as a conductive or insulating material, that is inserted in the sensor capping layer 720. The endpoint detection material 710 may comprise a conductive or insulating material, and is chosen to provide a good signal for endpoint detection during ion milling or other etching process of the cap layer 700, e.g., during SIMS (secondary ion mass spectroscopy) or other endpoint technique for endpoint detection in the ion milling process. Hence the conductive or insulating material 710 is used as a marker for the etching process control. In the case of SIMS detection during ion milling, oxidized metal generally gives a higher SIMS signal than its pure metallic form. Hence a metal-oxide maybe preferred in some cases, for more accurate endpoint detection. For example, when using SIMS endpoint control for ion milling, the layer 710 may be a 5-50 Å copper (Cu) layer that is inserted within the Ta sensor capping layer. Alternatively, layer 710 maybe a 5~25 Å aluminum oxide (AlO) or magnesium oxide (MgO) layer. As the ion milling proceeds through the sensor capping layer, the endpoint signal would show the signal from layer 710, i.e., the Cu, AlO or MgO marker, and indicate when to precisely stop the ion milling process.

Figure 8:
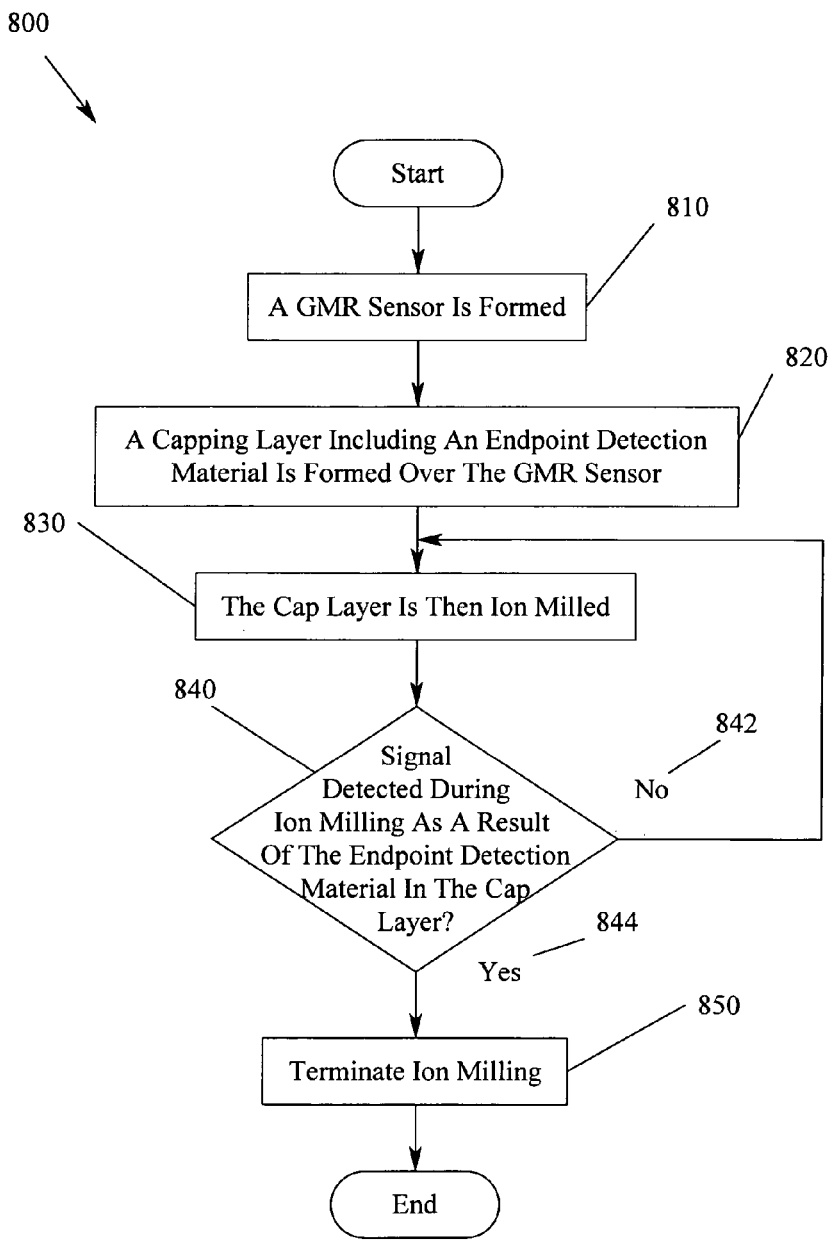
FIG. 8 is a flow chart of a method for providing an endpoint layer for ion milling of top of read sensor having top lead connection according to an embodiment of the present invention.

FIG. 8 is a flow chart 800 of a method for providing an endpoint layer for ion milling of top of read sensor having top lead connection according to an embodiment of the present invention. A GMR sensor is formed 810. A capping layer including an endpoint detection material, such as a conductive or insulating material, is formed over the GMR sensor 820. In the fabrication of a CPP read sensor, the sensor is electrically connected to the top shield (S2). Prior to depositing the S2 layer, the top of the read sensor has to be etched in order to make a good electrical contact between the sensor and S2. To provide precise control of the ion milling of the cap layer, the conductive or insulating material is inserted in the cap layer. The cap layer is then ion milled 830. The ion milling is performed until a signal is detected as a result of the conductive or insulating material in the cap layer 840. If the signal is not detected 842, the ion milling continues. If the signal is detected 844, the ion milling is terminated 850. The ion milling may be terminated immediately or after a specific time interval has passed after detecting the said signal. If a metal oxide is chosen for the marker layer, the ion milling or other etching process has to be continued until the metal oxide is completely removed, to ensure good electrical contact.

The conductive or insulating material thus prevents the over etching of the cap layer and allows the ion milling process to be performed without under-etching.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for providing an endpoint layer for ion milling of top of read sensor having top lead connection, comprising:
   forming a cap layer over and in contact with a read sensor;
   forming an endpoint detection layer within the cap layer for producing a signal for controlling removal of the cap layer and for providing an indicator for basing a termination of the removal of the cap layer so that cap layer material is over the top of and underneath the endpoint detection layer; and
   using the indicator to completely remove the cap material over the endpoint detection material and to completely remove the endpoint detection layer.

2. The method of claim 1, wherein the endpoint detection layer comprises a conductive material formed within the cap layer.

3. The method of claim 1, wherein the endpoint detection layer comprises an insulation material formed within the cap layer.

4. The method of claim 1, wherein the forming an endpoint detection layer within the cap layer further comprises forming a layer of copper within the cap layer.

5. A method for forming a read sensor, comprising:
   forming a cap layer over and in contact with a sensor element;

forming an endpoint detection layer within the cap layer for producing a signal for controlling removal of the cap layer and for providing an indicator for basing a termination of the removal of the cap layer so that cap layer material is over the top of and underneath the endpoint detection layer;

ion milling the cap layer; and monitoring the ion milling until the signal produced by the endpoint detection layer is detected and controlling termination of the ion milling based on the signal produced by the endpoint detection material to completely remove the cap material over the endpoint detection material and to completely remove the endpoint detection layer.

6. The method of claim 5, wherein the forming the endpoint detection layer further comprises forming a conductive material formed within the cap layer.

7. The method of claim 5, wherein the forming the endpoint detection layer further comprises an insulation material formed within the cap layer.

8. The method of claim 5 further comprising:

terminating the ion milling when the signal produced by the endpoint detection layer ceases, or after a specific time interval has passed after the signal produced by the endpoint detection layer ceases; and electrically connecting the sensor element to a top shield layer after terminating the ion milling of the cap layer.

9. The method of claim 5, wherein the forming an endpoint detection layer within the cap layer further comprises forming a layer of copper within the cap layer.

10. A magnetoresistive sensor, comprising:

a first shield layer;

a tunnel valve sensor element formed over the first shield layer; and a cap layer formed over and in contact with the tunnel valve sensor element; the cap layer including an endpoint detection layer disposed within the cap layer so that cap layer material is over the top of and underneath the endpoint detection layer, the endpoint detection layer producing a signal for controlling complete removal of the cap material over the endpoint detection material and complete removal of the endpoint detection layer and for providing an indicator for basing a termination of the complete removal of the cap material over the endpoint detection material and complete removal of the endpoint detection layer.

11. The method of claim 10, wherein the endpoint detection layer comprises a conductive material formed within the cap layer.

12. The method of claim 10, wherein the endpoint detection layer comprises an insulation material formed within the cap layer.

13. The magnetoresistive sensor of claim 10 further comprising a top shield layer electrically connected to the tunnel valve sensor element.

14. The magnetoresistive sensor of claim 10, wherein the endpoint detection layer disposed within the cap layer further comprises a layer of copper disposed within the cap layer.

15. A magnetic storage system, comprising:

a moveable magnetic storage medium for storing data thereon;

an actuator positionable relative to the moveable magnetic storage medium; and a magnetoresistive sensor, coupled to the actuator, for reading data from the magnetic recording medium when position to a desired location by the actuator, wherein the magnetoresistive sensor further comprises:

a first shield layer;

a tunnel valve sensor element formed over the first shield layer; and a cap layer formed over and in contact with the tunnel valve sensor element; the cap layer including an endpoint detection layer disposed within the cap layer so that cap layer material is over the top of and underneath the endpoint detection layer, the endpoint detection layer producing a signal for controlling complete removal of the cap material over the endpoint detection material and complete removal of the endpoint detection layer and for providing an indicator for basing a termination of the complete removal of the cap material over the endpoint detection material and complete removal of the endpoint detection layer.

16. The magnetic storage system of claim 15, wherein the endpoint detection layer comprises a conductive material formed within the cap layer.

17. The magnetic storage system of claim 15, wherein the endpoint detection layer comprises an insulation material formed within the cap layer.

18. The magnetic storage system of claim 15, wherein the endpoint detection layer disposed within the cap layer further comprises a layer of copper disposed within the cap layer.

19. A magnetoresistive sensor, comprising:

means for sensing magnetic data recorded on a magnetic recording media;

first means, coupled to the means for sensing, for providing a shield to a sensor element; and means, coupled to and in contact with the means for sensing, for protecting the means for sensing; the means for protecting including means, disposed within the means for protecting, for producing a signal so that the means for protecting is disposed over the top of and underneath the means for producing the signal, the means for producing the signal farther controlling complete removal of the means for protecting disposed over the means for producing the signal and complete removal of the means for producing the signal by providing an indicator for basing a termination of the complete removal of the means for protecting disposed over the means for producing the signal and complete removal of the means for producing the signal.

* * * * *

UNITED STATES PATENT AND TRADEMARK OFFICE
CERTIFICATE OF CORRECTION

PATENT NO. : 7,623,325 B2 Page 1 of 1
APPLICATION NO. : 11/239514
DATED : November 24, 2009
INVENTOR(S) : Wipul Pemsiri Jayasekara It is certified that error appears in the above-identified patent and that said Letters Patent is hereby corrected as shown below:

Col. 8, line 48: "farther" should read --further--

Signed and Sealed this

Fourteenth Day of September, 2010

David J. Kappos
*Director of the United States Patent and Trademark Office*